US012087808B2

(12) United States Patent
Dos Santos Viegas

(10) Patent No.: US 12,087,808 B2
(45) Date of Patent: Sep. 10, 2024

(54) ENSURING MINIMUM DENSITY COMPLIANCE IN INTEGRATED CIRCUIT INDUCTORS

(71) Applicant: Silicon Laboratories Inc., Austin, TX (US)

(72) Inventor: Eduardo Jose Dos Santos Viegas, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1038 days.

(21) Appl. No.: 16/942,078

(22) Filed: Jul. 29, 2020

(65) Prior Publication Data

US 2022/0037457 A1    Feb. 3, 2022

(51) Int. Cl.
| | | |
|---|---|---|
| *H01F 27/28* | (2006.01) | |
| *G06F 30/398* | (2020.01) | |
| *H01F 41/04* | (2006.01) | |
| *H01L 23/58* | (2006.01) | |
| *H01L 49/02* | (2006.01) | |
| *H05K 1/16* | (2006.01) | |

(52) U.S. Cl.
CPC ............ *H01L 28/10* (2013.01); *G06F 30/398* (2020.01); *H01F 27/2804* (2013.01); *H01F 41/041* (2013.01); *H01L 23/585* (2013.01); *H05K 1/165* (2013.01)

(58) Field of Classification Search
CPC ........ G06F 30/33; G06F 30/39; G06F 30/398; H01F 2017/0053; H01F 2027/348; H01F 27/34; H01F 27/28; H01F 27/2804; H01F 17/0006; H01F 2017/0073; H01F 2017/0086; H01L 23/585; H01L 23/645; H01L 28/10; H05K 1/165
See application file for complete search history.

(56) References Cited

U.S. PATENT DOCUMENTS

| | | | |
|---|---|---|---|
| 7,262,481 B1* | 8/2007 | Marques ................. | H01L 28/10 257/E21.022 |
| 9,002,306 B2 | 4/2015 | Li et al. | |
| 9,948,313 B1* | 4/2018 | Rafi ......................... | H03L 7/193 |
| 2006/0163692 A1* | 7/2006 | Detecheverry ...... | H01L 23/5222 257/E23.144 |
| 2007/0228515 A1* | 10/2007 | Asahi ..................... | H01L 23/522 257/E21.022 |
| 2008/0179719 A1* | 7/2008 | Nakashiba .............. | H01L 23/66 257/664 |
| 2010/0328546 A1 | 12/2010 | Rafi et al. | |
| 2014/0252542 A1* | 9/2014 | Lee ........................ | H01L 23/522 438/381 |
| 2016/0351653 A1* | 12/2016 | Tsai ........................ | H01L 28/10 |
| 2020/0066438 A1* | 2/2020 | Lee ......................... | H01L 28/10 |

* cited by examiner

*Primary Examiner* — Scott B Geyer
*Assistant Examiner* — Tyler J Wiegand
(74) *Attorney, Agent, or Firm* — Trop, Pruner & Hu, P.C.

(57) ABSTRACT

In one aspect, an inductor may include at least one loop formed on a first metal layer and a non-uniform introduced pattern formed on the first metal layer and circumscribed by the at least one loop. The non-uniform introduced pattern may be formed of a plurality of structures and may have a maximum density at an interior portion thereof and a minimum density at a peripheral portion thereof, where at least some of the plurality of structures have different sizes.

11 Claims, 7 Drawing Sheets

ENSURING MINIMUM DENSITY COMPLIANCE IN INTEGRATED CIRCUIT INDUCTORS

BACKGROUND

Integrated circuits often include integrated inductors for use in radio frequency circuits. These inductors are often large structures on the integrated circuit, formed of metal loops with large empty areas inside to avoid quality Q factor degradation due to eddy currents and capacitive coupling. Modern integrated circuit manufacturing often dictates that metal layers have a minimum density uniformity and density gradients, to avoid degradation of the manufactured device in certain manufacturing steps, like chemical mechanical polishing, where metal structures may be degraded due to a phenomenon called dishing. To resolve this issue, often a redundant pattern is inserted into the empty area. However typical patterns, which use a uniform pattern, can degrade the Q factor of the inductor.

SUMMARY OF THE INVENTION

In one aspect, an apparatus includes an inductor formed on a semiconductor die. The inductor may include: at least one loop formed on a first metal layer; and a non-uniform introduced pattern formed on the first metal layer and circumscribed by the at least one loop. The non-uniform introduced pattern may be formed of a plurality of structures and have a maximum density at an interior portion thereof and a minimum density at a peripheral portion thereof, where at least some of the plurality of structures have different sizes.

In an implementation, the non-uniform introduced pattern comprises a fractal pattern. The fractal pattern may include: a first plurality of structures having a first size; and a second plurality of structures having a second size, the second size smaller than the first size. The fractal pattern may further include a third plurality of structures having a third size, the third size smaller than the second size, and where an edge portion of each of the third plurality of structures at least substantially aligns with an edge portion of at least one of the second plurality of structures. A spacing between a first structure of the first plurality of structures and a first structure of the second plurality of structures may be at least substantially of a minimum spacing according to according to design rule checking (DRC) requirements. At least some of the first plurality of structures define a quadrant of spaces and at least one of the second plurality of structures is located within each of the quadrant of spaces. The first plurality of structures may have a plus-shaped pattern, including a horizontal portion having at least substantially a minimum width according to the DRC requirements and a vertical portion having at least substantially the minimum width.

In some implementations, the fractal pattern is formed of a plurality of structures having substantially a minimum width according to the DRC requirements. One or more of the plurality of structures may be truncated.

In another implementation, the plurality of structures comprises a plurality of concentric substantially square patterns, each of the plurality of concentric substantially square patterns having at least substantially a minimum width according to the DRC requirements. A first structure of the plurality of concentric substantially square patterns has a first opening, and a second structure of the plurality of concentric substantially square patterns adapted about the first structure has a second opening. The first structure may be separated from the second structure by at least a minimum spacing according to the DRC requirements.

In another aspect, an apparatus includes: an inductor formed on a semiconductor die, the inductor comprising at least one loop formed on a metal layer; and a non-uniform introduced fractal pattern formed on the metal layer and circumscribed by the at least one loop. The non-uniform introduced fractal pattern may include: a first plurality of structures each having a horizontal portion and a vertical portion, the horizontal portion and the vertical portion having at least substantially a minimum width according to the DRC requirements; and a second plurality of structures each adapted at least substantially at a minimum distance according to the DRC requirements from at least one of the first plurality of structures,. Each of the second plurality of structures may be smaller than the first plurality of structures and have a horizontal portion and a vertical portion, the horizontal portion and the vertical portion having at least substantially the minimum width.

In an implementation, an edge portion of each of the second plurality of structures at least substantially aligns with an edge portion of at least one of the first plurality of structures. At least some of the first plurality of structures may define a quadrant of spaces and at least one of the second plurality of structures is located within each of the quadrant of spaces. The non-uniform fractal pattern may further comprise a third plurality of structures each adapted at least substantially at the minimum distance according to the DRC requirements from at least one of the first plurality of structures and at least one of the second plurality of structures. Each of the third plurality of structures may be larger than the second plurality of structures and have a horizontal portion and a vertical portion, the horizontal portion and the vertical portion having at least substantially the minimum width. One or more of the first plurality of structures and/or one or more of the second plurality of structures may have different shapes.

In one implementation, the non-uniform fractal pattern may further comprise another structure at a peripheral potion thereof, the another structure having at least substantially the minimum width and comprising a shape different than the first plurality of structures and the second plurality of structures.

The apparatus may be an oscillator that includes: a first plurality of transistors coupled between a first voltage node and an output node; a second plurality of transistors coupled between a second voltage node and the output node; and a load circuit coupled to the output node. The load circuit may include the inductor and at least one capacitor, where the oscillator is to output an oscillation signal at the output node.

In yet another aspect, a method comprises: forming a top metal layer above a semiconductor wafer; patterning the top metal layer to include at least one loop of an inductor and a non-uniform introduced pattern circumscribed by the at least one loop, the non-uniform introduced pattern formed of a plurality of recursive structures and having a maximum density at an interior portion thereof and a minimum density at a peripheral portion thereof, wherein at least some of the plurality of structures have different sizes; and depositing a field oxide over the patterned top metal layer.

In an implementation, the method further comprises chemical mechanical polishing a top portion of the field oxide and the patterned top metal layer.

DETAILED DESCRIPTION

In various embodiments, a non-uniform introduced pattern may be included in an area circumscribed by one or more inductor loops. Note that this pattern may be non-uniform, in that it is formed of constituent structures that have varying shapes and sizes, to reduce Q factor degradation. More specifically, a pattern in accordance with an embodiment may have a suitable ratio of increasing metal density versus Q factor degradation. Such pattern may have a higher metal density in a substantial central portion of the pattern, and a lower metal density moving towards a periphery of the pattern.

Figure 1:
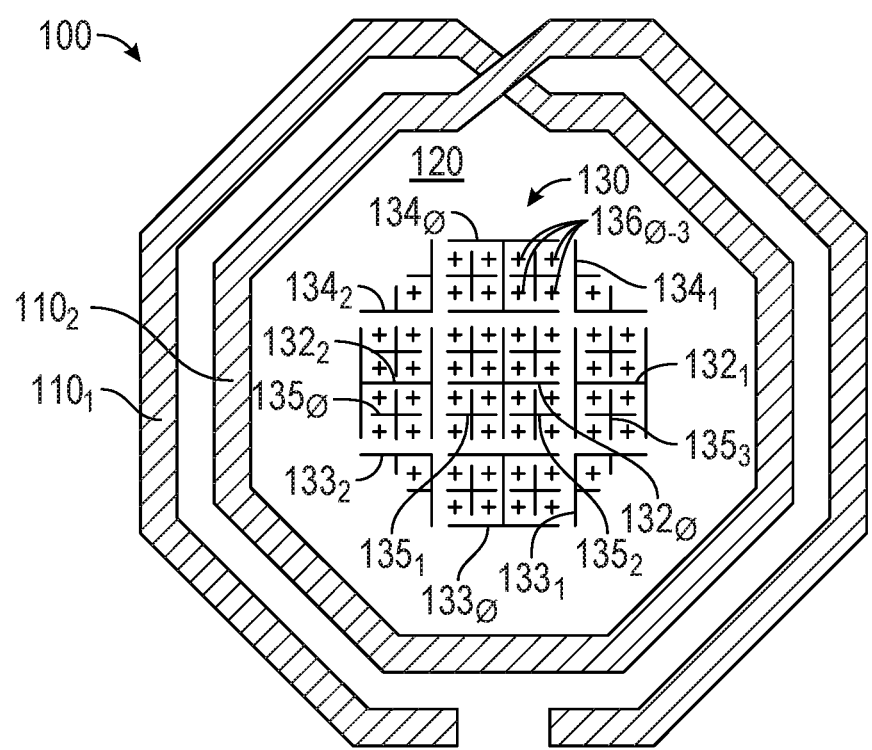
FIG. 1 is an illustration of an inductor having a non-uniform introduced pattern in accordance with an embodiment.

Referring now to FIG. 1, shown is an illustration of an inductor having a non-uniform introduced pattern in accordance with an embodiment. As shown in FIG. 1, inductor 100 is formed of multiple metal loops $110_1$, $110_2$, which may be implemented on a given metal layer, e.g., a top metal layer of a semiconductor die. Note that the crossover portion of loop $110_1$ may be formed on another metal layer to prevent a short. In other cases inductor loops can also be squared or in a circle (for fabs that support it), and may also be in pairs as in a figure 8.

As described above, many semiconductor manufacturing facilities have design rules that require a minimum and maximum density of metal across designated repeatable areas in the die for most metal layers, as well as requiring a maximum density gradient. The design rules may be referred to as design rule checking (DRC) requirements. For example, DRC requirements may call for a minimum density that is at least a threshold percentage per unit area. Similarly, DRC requirements may call for a density gradient such that between two adjacent unit areas, a maximum density gradient or difference between density in the two unit areas does not exceed a given threshold percentage, thus limiting the rate of change in metal density between adjacent unit areas. While implementations may vary, as an example a minimum density may be between approximately 5 and 20 percent. And similarly, a maximum density gradient may be less than approximately 20 percent.

Still with reference to FIG. 1, an introduced pattern 130 is included in an area 120 circumscribed by inner loop $110_2$. As shown, introduced pattern 130 includes non-uniform structures having different sizes at least, and possibly different shapes. Note that introduced pattern 130 is a so-called dummy pattern, in that it does not connect to any circuitry within the integrated circuit. Instead its only function is to provide the required minimum density without violation of maximum density gradient, such that undesired effects to actual circuitry such as inductor 100 as a result of additional semiconductor processing steps (e.g., chemical mechanical polishing) can be avoided.

Before details of introduced pattern 130 are described, general considerations in developing a non-uniform introduced pattern are discussed. With embodiments, different particular patterns may be designed that are optimized for increasing metal density to ensure compliance with design rules while reducing, as much as possible, Q factor degradation.

As a first general consideration, an introduced pattern may be designed that has greater density in a center portion where a magnetic field is weaker. In addition, the introduced pattern may be designed to at least substantially maintain a minimum predetermined distance from the introduced pattern to an inner loop of the inductor (here inner loop $110_2$). In a particular embodiment, this minimum distance may be at least some multiple of the distance from the metal layer to a substrate to be effective. Although embodiments are not limited in this regard, as an example, a top metal layer (e.g., a metal 7 layer) may be formed in the order of 50-200 microns above a substrate. In this example, the introduced pattern may be designed to substantially maintain a minimum distance of at least 8× from the inner loop. As will be described further herein, according to the particular shape of an inductor, e.g., octagonal shape, certain structures within the introduced pattern may be cut or shaved to at least substantially maintain this distance.

Additional general considerations for an introduced pattern include forming the structures of the introduced pattern with elongated shapes as opposed to squarish or circular shapes, as such patterns may slightly increase resistance to eddy currents.

Referring to the specific implementation shown in FIG. 1, introduced pattern 130 is a fractal-based pattern, in that it is formed recursively with individual structures or patterns of varying size. As illustrated, the general arrangement of structures included in introduced pattern 130 is of a "plus" symbol pattern (+). Note that each structure may be formed having a minimum width. This minimum width is the smallest width according to given design rules. As an example, DRC requirements for a particular facility may state a minimum line width to be between approximately 0.5 and 2 microns. Each structure included in introduced pattern 130 may be formed of lines having this minimum width. By forming structures of introduced pattern 130 having minimum width lines, eddy currents may be minimized. Of course in other cases, the lines need not be exactly of this minimum width or minimally spaced, and instead may be at least substantially of the minimum width and more spaced. To this end, it is possible for lines to be formed wider than the minimum width size and to be more spaced, although it may slightly affect performance. And in some cases it is possible to have at least certain structures with lines of widths even smaller than the minimum line width DRC requirements, if allowed by a given fab.

To meet minimum density and maximum density gradient requirements while maintaining good performance for inductor 100, density may desirably be increased in a center portion of introduced pattern 130. That is, introduced pattern 130 may have a non-uniform density with greater density of metal in a substantial central portion of area 120 where a weaker magnetic field exists, such that less degradation results. And in turn, introduced pattern 130 may have lesser density in a peripheral portion of area 120.

To this end, a set of structures 132 having a first size may be located in a center portion of introduced pattern 130. As shown, in a center portion of area 120, a structure 132o is formed of a 'plus' pattern having relatively long lines with minimum width. In turn, additional structures $132_{1,2}$ are formed adjacent to structure $132_0$ at a minimal spacing according to DRC requirements. Note that these structures may be of a slightly different pattern, namely 'H' patterns. This is so, given the amount of area of introduced pattern 130 and distance from inner loop $110_2$ and to terminate the pattern boundaries in an optimized fashion. In other implementations, of course additional plus patterns may be included in the center portion.

As further shown, descending and ascending in the vertical direction from structures 132, additional structures 133, 134 having substantially the same first size may be present. Structures $133_0$ and $134_0$ may be 'H' patterns that are horizontally adapted or sideways. Note that structures $133_{1,2}$ and $134_{1,2}$ may be truncated 'plus' patterns, given their location at a periphery of introduced pattern 130. This is so, as it desirable to maintain a maximum distance between introduced pattern 130 and inner loop $110_2$, to reduce Q factor degradation. As shown, with an octagon-shaped loop pattern for inductor 100, these peripheral structures may be diagonally shaved to at least substantially maintain a predetermined distance between introduced pattern 130 and inner loop $110_2$.

Collectively, structures 132-134 form a first plurality of structures. As shown in FIG. 1 and described above, the structures may be formed to be a first size (note that certain of the structures may be truncated or of different size). As an example, this first size can, in horizontal and vertical portions, extend up to approximately 21 times the minimum metal width and spacing in length, which depending on the technology used could be close to 21 microns. As a result of configuration of this first plurality of structures within introduced pattern 130, available space remains. As shown FIG. 1 when considering only the first plurality of structures, the available space includes multiple generally square spaced areas.

In turn, within these available spaces, additional structures may be recursively formed, with smaller dimensions (lengths) than the first size that forms structures 132-134 of the first plurality of structures. More specifically, a second plurality of structures may be located within the available space about the first plurality of structures. These second plurality of structures also may be formed of plus-shaped patterns. Representative structures $135_0$-$135_3$ are enumerated in FIG. 1. Additional structures formed of the same plus-shaped patterns may be located in descending and ascending vertical directions from structures 135, as shown in FIG. 1.

As shown, structures 135 may be located within the available space and formed of a second size. Note this second size may be smaller than the first size. As an example, this second size may, in horizontal and vertical portions, extend up to approximately 9 microns. In addition, structures 135 are formed with a minimum width and a length as large as possible to meet minimal spacing requirements of design rules. That is, a second plurality of structures of this second size may extend (vertically and/or horizontally) towards adjacent structures of the first plurality of structures to a minimal spacing allowed according to DRC requirements. As an example, design rules may call for a minimum spacing between structures of approximately 1 micron. By extending the second plurality of structures to this minimum spacing, density thus increases.

A recursive pattern of forming additional pluralities of structures of smaller size that fit within available spaces may continue for one or more additional levels. In the embodiment shown in FIG. 1, a third plurality of structures is located within the available space about the first and second pluralities of structures. These third plurality of structures also may be formed of plus-shaped patterns. Representative structures $136_0$-$136_3$ are enumerated in FIG. 1. Additional structures formed of the same plus-shaped patterns may be located in both horizontal and vertical directions from structures 136 as shown in FIG. 1. The previous sizing choices allows for structures 136 to be located within the available space and formed of a third size, with a minimum width, length and spacing that meets the minimum spacing requirements of design rules (e.g., 1 micron, including minimum edge length).

While not shown entirely to scale in the Figures herein, understand that in some cases, the various structures may be substantially aligned in horizontal and vertical directions at edge portions thereof. In this way, a structure 135 may provide open quadrant spacing into which four structures 136 may be located. As seen, structures 136 may have vertical edges that extend at least substantially to vertical edges of at least one structure 135. And similarly, structures 136 may have horizontal edges that extend at least substantially to horizontal edges of at least one structure 135. Such substantial alignment also may be achieved between structures of first and third pluralities of structures and the first and second pluralities of structures equally.

While three levels of structures are shown in the example of FIG. 1, understand that additional or fewer levels may be present in other implementations by choosing appropriate length-to-rule ratios as a function of the hierarchy level. Furthermore, understand that the shape of the structures may take other forms as well. For example, in other implementations instead of 'plus' shapes or 'H' shapes, other shapes such as squares, rectangles or shaping similar to the loops (e.g., octagons in this case) or so forth may be present. Further understand that even in an implementation in which a single shape is provided, the resulting introduced pattern is still non-uniform, as this single shape structure may be formed with non-uniform density (greater density centrally than peripherally) and multiple different sizes to comply with design rules while reducing impact on inductor performance.

Of course other designs for an introduced pattern are possible. For example, variations of a pattern such as in FIG. 1 may be used when an inductor is a figure 8 pattern, to ensure that a minimum distance between an introduced pattern and an inner loop of the inductor is maintained.

Figure 2:
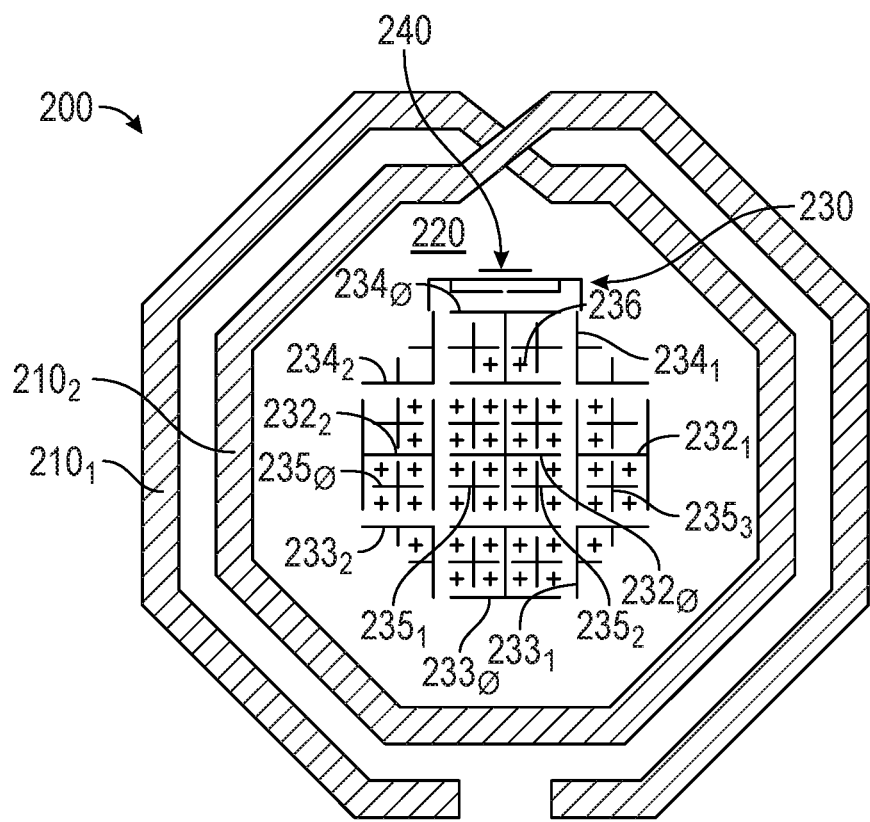
FIG. 2 is an illustration of an inductor having a non-uniform introduced pattern in accordance with another embodiment.

Referring now to FIG. 2, shown is an illustration of an inductor having a non-uniform introduced pattern in accordance with another embodiment. As shown in FIG. 2, inductor 200 is formed of multiple metal loops $210_1$, $210_2$ formed on a top metal layer of a semiconductor die. An introduced pattern 230 is included in an area 220 circumscribed by inner loop $210_2$.

As shown, introduced pattern 230 includes non-uniform structures having different sizes and different shapes. In general, introduced pattern 230 may be substantially the same as introduced pattern 130 of FIG. 1. However, note that certain 'plus' patterns of a smaller size may be removed from a periphery. This may be due to sufficiently meeting minimum density and maximum gradient requirements without the need for these additional structures, thus reducing Q factor degradation. While not shown to scale in FIG. 2, note that instead of a symmetric octagonal inductor shape, the inductor may take form of a figure 8.

In such embodiment, as in FIG. 2, with a more irregular area 220 circumscribed by inner loop $210_2$, note the presence of an additional structure 240. As shown, structure 240 also may be formed of individual structures having the minimum width according to the DRC requirements. Understand that presence of additional structure 240 may be required enable minimum density requirements and maximum density gradients to be achieved due to higher density in the upper adjacent area due to the figure 8 metal crossing. Thus, greater distances exist between the 'plus' patterns at the top of introduced pattern 230 and inner loop $210_2$.

Figure 3:
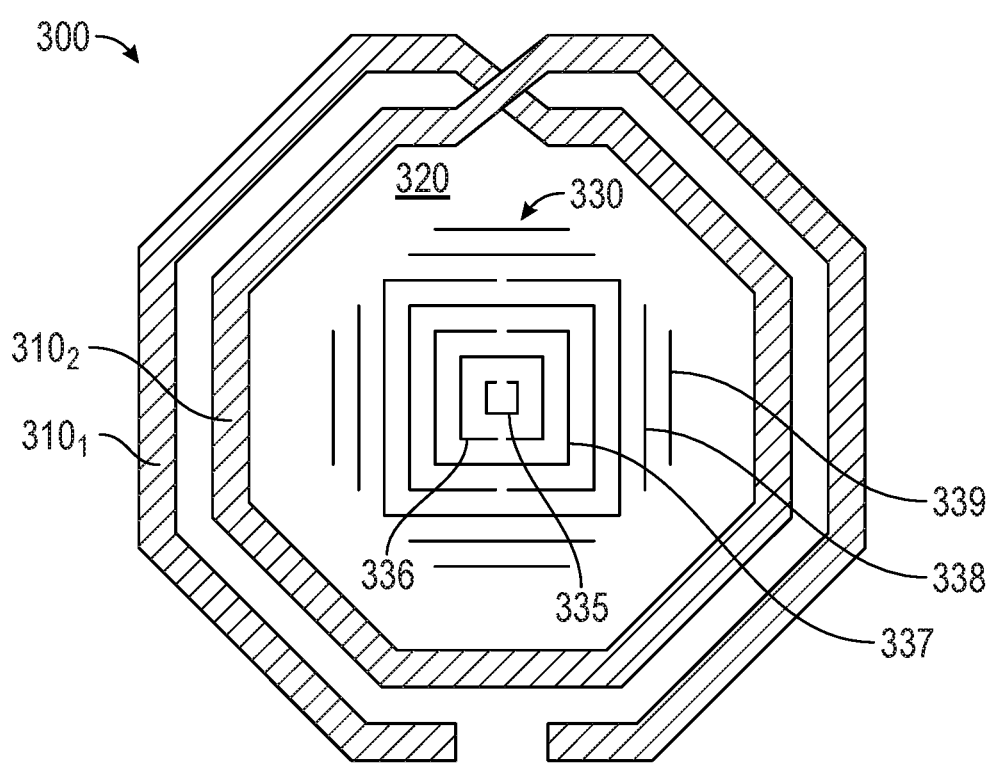
FIG. 3 is an illustration of an inductor having a non-uniform introduced pattern in accordance with another embodiment.

Referring now to FIG. 3, shown is an illustration of an inductor having a non-uniform introduced pattern in accordance with another embodiment. As shown in FIG. 3, inductor 300 is formed of multiple metal loops $310_1$, $310_2$, which may be implemented on a top metal layer of a semiconductor die.

Still with reference to FIG. 3, an introduced pattern 330 is included in an area 320 circumscribed by inner loop $310_2$. As shown, introduced pattern 330 includes non-uniform structures having different sizes and different shapes. More specifically, shown in FIG. 3, introduced pattern 330 is formed of a plurality of concentric substantially square structures. As detailed, certain ones of the structures are enumerated with reference numerals. Specifically, an internal structure 335 may be formed as a substantial square, but with a minimum spacing gap in the top thereof to prevent a loop, which could cause an unwanted current from flowing, causing Q factor degradation. Structure 335 may be formed of this substantial square having a minimum width according to DRC requirements and minimum spacing according to DRC requirements on its top portion. In turn, a next concentric substantial square structure 336 may be formed around structure 335, located at a distance from it by the minimum spacing according to DRC requirements. Note that an open portion of this substantial square structure 336 may be at a bottom portion thereof. This alternating pattern of openings on opposite sides of the substantial squares continues, such as shown with structure 337 and others.

Thus, as shown in FIG. 3, introduced pattern 330 is formed of a concentric square arrangement where a smallest, thinnest and minimally spaced substantially square structure 335 is formed at a central portion of introduced pattern 330. Extending outwardly therefrom, a plurality of additional substantially square structures are recursively formed which encompass the previous substantially square structure in a smallest, thinnest and minimally spaced way.

As further illustrated in FIG. 3, at a periphery of introduced pattern 330, the structures may be chopped or shaved, such that sides of squares, such as illustrated structures 338, 339 are provided, to ensure minimum distance between introduced pattern 330 and inner loop $310_2$.

While a particular number of substantial square patterns are shown for ease of illustration, understand that more or fewer may be present in a given implementation. Further, while openings in the substantial square patterns are shown on top and bottom portions, these openings may equally be present on opposite horizontal sides and can also be absent when the squares are shaved on the corners, therefore opening the loop.

With this arrangement, introduced pattern 330 may meet minimum density and maximum density gradient requirements while maintaining good performance for inductor 300. This is so, as introduced pattern 330 may concentrate more metal in its center portion by way of this non-uniform density having a greater density of metal in a substantial central portion of area 320, where a weaker magnetic field is present, therefore minimizing the Q factor degradation.

Of course, other designs for an introduced pattern are possible. For example, variations of a pattern such as in FIG. 3 may be used when an inductor is a figure 8 pattern, to ensure that a maximum distance between an introduced pattern and the inner loop of the inductor is maintained.

Figure 4:
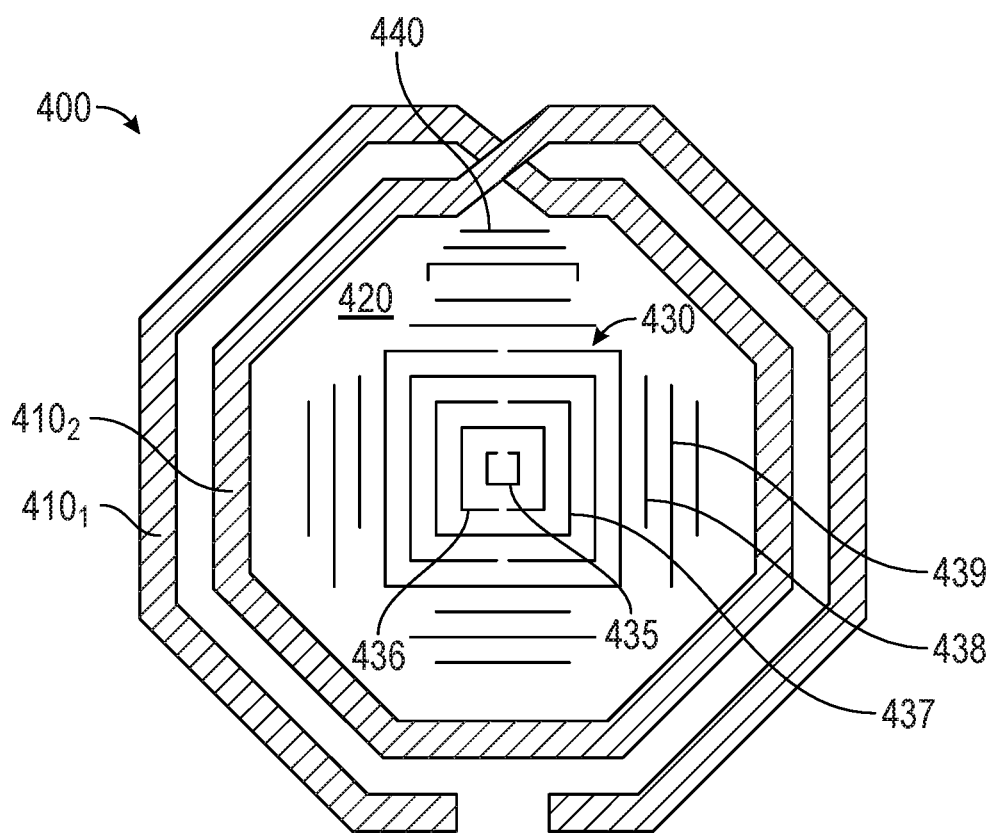
FIG. 4 is an illustration of an inductor having a non-uniform introduced pattern in accordance with another embodiment.

Referring now to FIG. 4, shown is an illustration of an inductor having a non-uniform introduced pattern in accordance with another embodiment. As shown in FIG. 4, inductor 400 is formed of multiple metal loops $410_1$, $410_2$ formed on a top metal layer of a semiconductor die. An introduced pattern 430 is included in an area 420 circumscribed by inner loop $410_2$.

As shown, introduced pattern 430 includes non-uniform structures having different sizes and different shapes. In general, introduced pattern 430 may be substantially the same as introduced pattern 330 of FIG. 3. While not shown to scale in FIG. 4, note that instead of a symmetric octagonal inductor shape, the inductor may take form of a figure 8.

In such embodiment, with a more irregular area 420 circumscribed by inner loop $410_2$, note the presence of an additional structure 440. As shown, structure 440 also may be formed of individual structures having the minimum width according to the DRC requirements. Understand that presence of additional structure 440 may be required to enable minimum density requirements and maximum density gradients to be achieved due to higher density in the upper adjacent area due to the figure 8 metal crossing.

As described above, an introduced pattern may be formed in connection with an integrated LC tank-based voltage controlled oscillator (VCO) inductor. However, understand that other introduced patterns of the above kind may be provided in an integrated circuit to provide substantial metal density and appropriate gradients in connection with other components such as LC mixers, impedance matching circuits, baluns, load circuits and so forth. Also understand multiple inductors may couple together to form a transformer. In one implementation, a transformer may be formed of concentrically formed inductors that share a common introduced pattern internal to the loops of the inductors.

Figure 5:
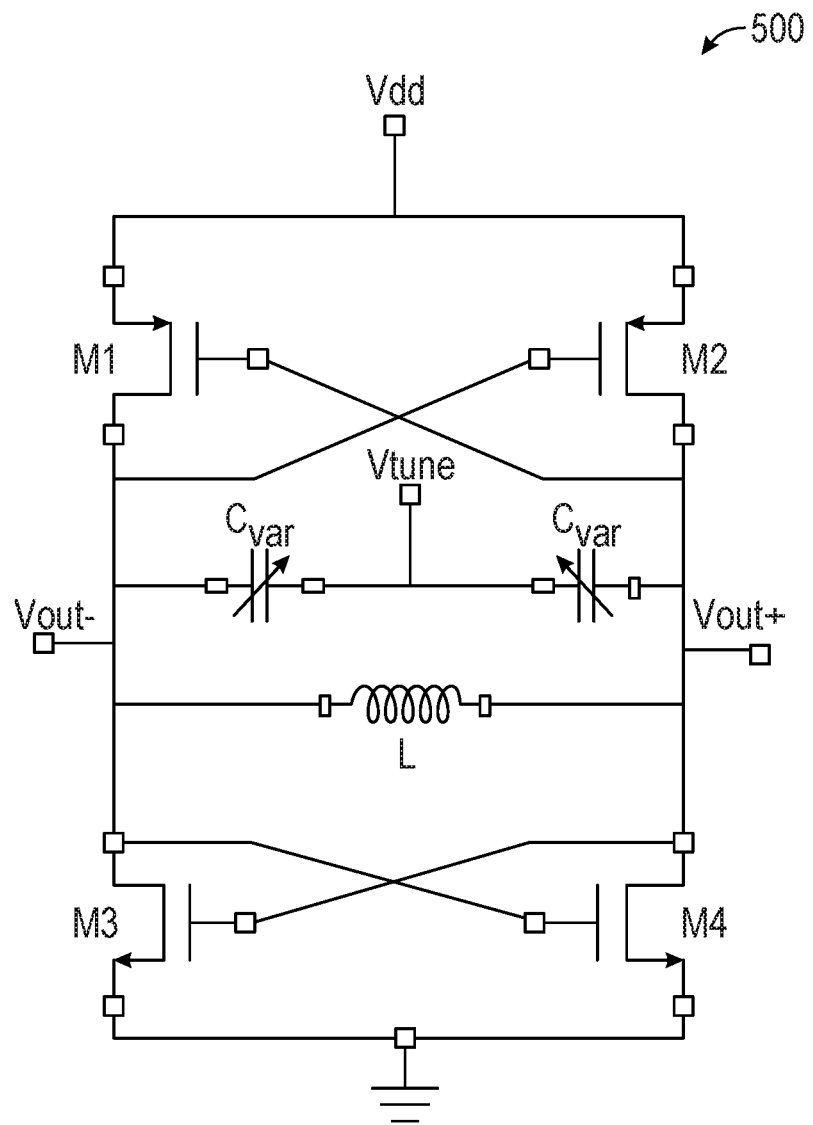
FIG. 5 is a schematic diagram of an oscillator in accordance with an embodiment.

An inductor having an introduced pattern as described herein may be used in many different circuits. As one representative implementation, an inductor may be included in a VCO such as a LC tank-based oscillator. Referring now to FIG. 5, shown is a schematic diagram of an oscillator 500 in accordance with an embodiment. As shown in FIG. 5, oscillator 500 has an amplifier formed by metal oxide semiconductor field effect transistors (MOSFET) devices M1, M2, M3 and M4 with a load formed of an LC tank, which is implemented with a parallel connected inductor L and capacitance formed of two series-coupled varactors Cvar. As shown, the LC tank couples to output nodes to output an oscillator signal, Vout+/−. As further shown, a tuning voltage node is coupled between the series-coupled varactors.

As further illustrated in FIG. 5, a supply voltage VDD is coupled to source terminals of a first pair of MOSFETs, namely p-channel (PMOS) devices M1 and M2. As shown, PMOS devices M1, M2 have cross-coupled gate terminals coupled to a drain terminal of the other device. In addition, their drain terminals are coupled to the corresponding output nodes. In addition, another pair of MOSFETs, namely n-channel MOSFETs (NMOS) devices M3, M4, couple between a reference voltage node (e.g., a ground) and the output nodes. As shown, NMOS devices M3, M4 have source terminals coupled to the reference voltage node, and cross-coupled gate terminals that in turn couple to the other device's drain terminal, which couples to the output nodes. Understand while shown at this high level in the embodiment of FIG. 5, many variations and alternatives are possible. Furthermore, understand that an inductor having a non-uniform introduced pattern may be used in many other circuits.

Figure 6:
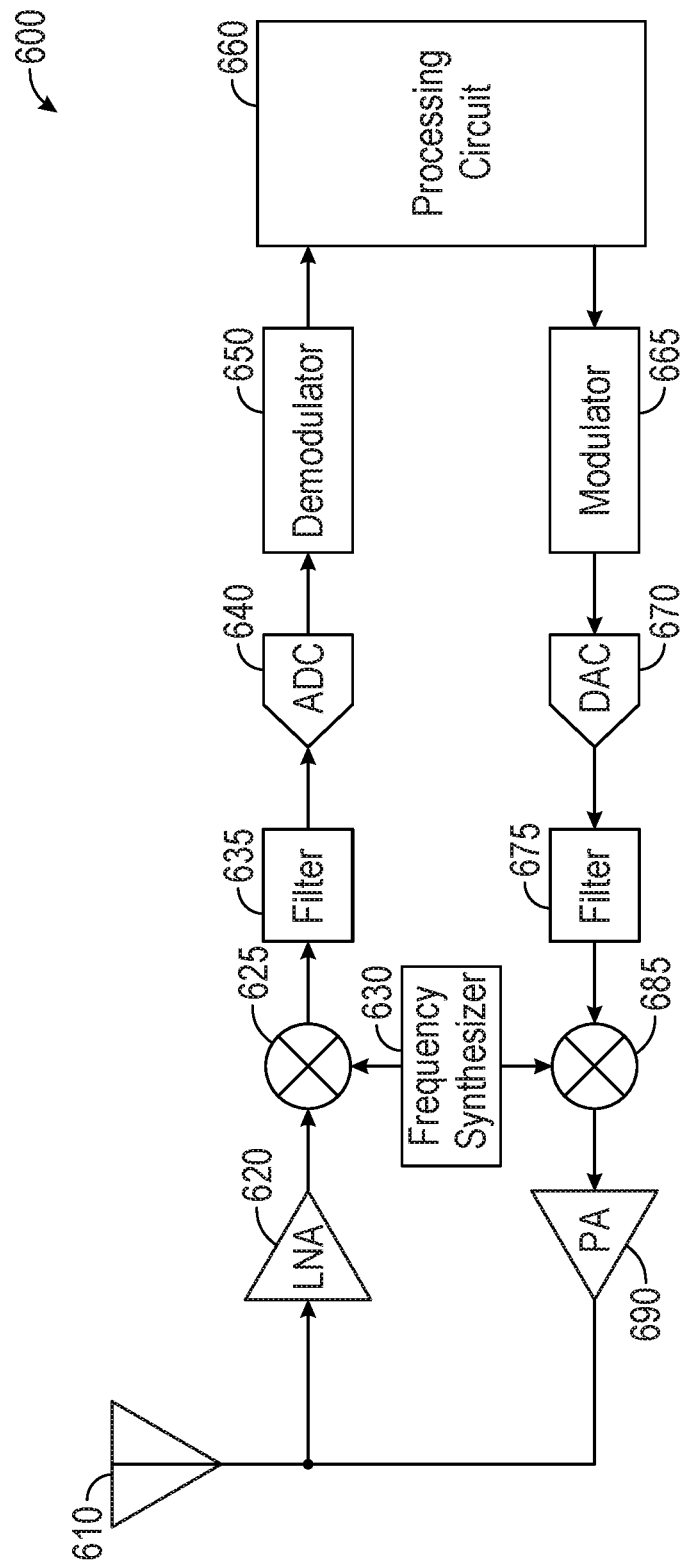
FIG. 6 is a block diagram of a system in accordance with an embodiment.

Referring now to FIG. 6, shown is a block diagram of a system in accordance with an embodiment. System 600 may be any type of device that includes a wireless transceiver. Understand that system 600 is shown at a high level, with only an antenna 610 and various components of a transceiver, which may be implemented in a single integrated circuit along with other components not shown. Of course, many other components may be present in system 600.

In a receive direction, an incoming radio frequency (RF) signal received by antenna 610 is provided to a low noise amplifier (LNA) 620 where it is amplified and provided to a mixer 625, which downconverts the RF signal to a lower frequency signal, e.g., an intermediate frequency (IF) signal. To this end, a frequency synthesizer 630 provides a mixing signal to mixer 625. Note that frequency synthesizer 630 may include a VCO with at least one inductor having a non-uniform introduced pattern as described herein. After downconversion, the resulting downconverted signal may be filtered in a filter 635 and digitized in an analog-to-digital converter (ADC) 640. From there, the resulting digitized signal is demodulated in a demodulator 650 and provided to processing circuitry 660.

In a transmit direction, information may be provided from processing circuit 660 to a modulator 665, which modulates the information and provides it to a digital-to-analog converter (DAC) 670, which converts the digitally demodulated information into an analog signal, which may be provided to a filter 675. After filtering, the resulting signal is upconverted in a mixer 685, which also may receive a mixing signal from frequency synthesizer 630. In turn, the resulting RF signal is amplified in a power amplifier 690 and output via antenna 610. Understand while shown at this high level in the embodiment of FIG. 6, many variations and alternatives are possible.

Figure 7:
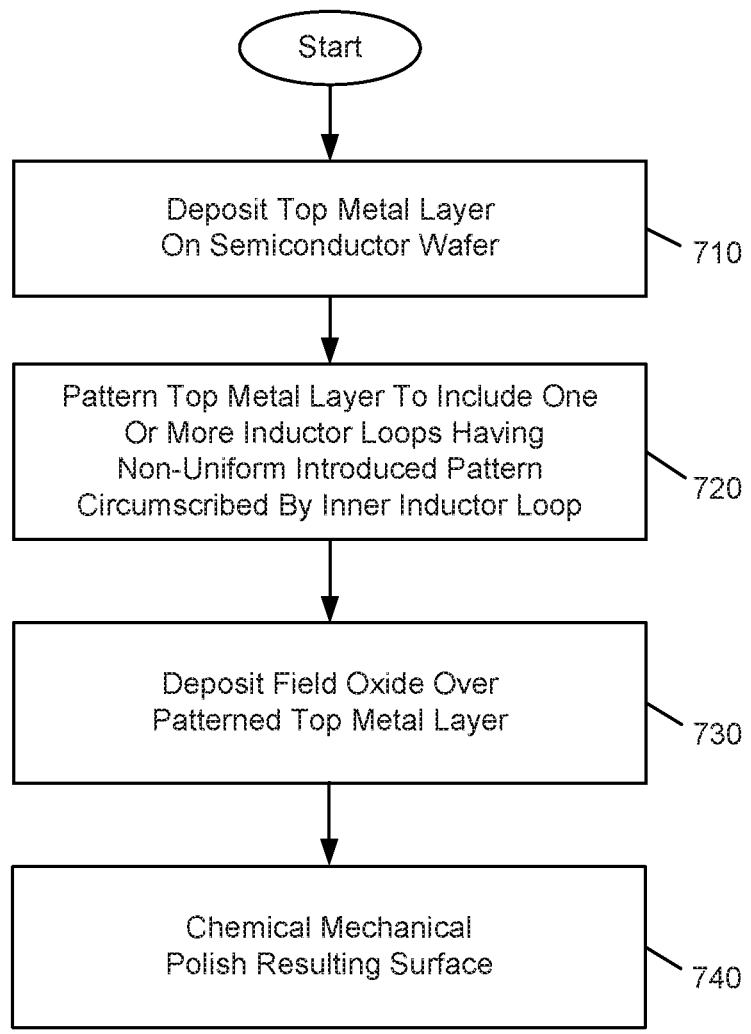
FIG. 7 is a flow diagram of a method in accordance with an embodiment.

Referring now to FIG. 7, shown is a flow diagram of a method in accordance with an embodiment. As shown in FIG. 7, method 700 is a method of semiconductor processing for forming integrated circuits having inductors and introduced patterns as described herein. Understand that method 700 is shown at a high level, and many additional semiconductor processing steps may be performed in fabricating a given integrated circuit.

As illustrated, method 700 begins by depositing a top metal layer on a semiconductor wafer (block 710). Understand that prior to deposition of this top metal layer, additional layers have already been formed, patterned, and otherwise processed to form circuitry of the integrated circuit. In particular, understand that one or more metal layers below this top metal layer may include one or more loops of an inductor for which one or more additional loops may be formed on this top metal layer. Next at block 720 that top metal layer may be patterned. As part of the patterning, one or more inductor loops may be formed. Furthermore, circumscribed within an innermost loop of one or more inductors, a non-uniform introduced pattern may be included as part of the patterning. In embodiments herein, this non-uniform introduced pattern may be formed of a fractal-based pattern, a concentric substantially square pattern arrangement or other non-uniform pattern.

Still with reference to FIG. 7, after patterning this top metal layer, a field oxide may be deposited over the top metal layer (block 730). Then at block 740, chemical mechanical polishing may be performed on the resulting surface having the top metal layer and the field oxide. With the introduction of such non-uniform introduced pattern within an innermost loop of one or more inductors, deleterious effects of additional processing such as this chemical mechanical polishing may be reduced, while at the same time maintaining an acceptable level of performance of the inductor, by limiting the Q factor degradation (e.g., reduction).

Understand that additional processing following this chemical mechanical polishing may be performed, including planarization, among other steps to realize a completely formed wafer, which may then be diced and packaged into separate integrated circuits.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an inductor formed on a semiconductor die, the inductor comprising:
   at least one loop formed on a first metal layer; and
   a non-uniform introduced pattern formed on the first metal layer and circumscribed by and internal to the at least one loop, wherein the non-uniform introduced pattern is formed of a plurality of structures, wherein a first collection of the plurality of structures has a maximum density, the first collection of the plurality of structures located at an interior portion of the non-uniform introduced pattern and a second collection of the plurality of structures has a minimum density, the second collection of the plurality of structures located at a peripheral portion of the non-uniform introduced pattern, wherein at least some of the plurality of structures have different sizes, the plurality of structures comprising:
   a first plurality of structures having a first size;
   a second plurality of structures having a second size, the second size smaller than the first size; and
   a third plurality of structures having a third size, the third size smaller than the second size, and wherein an edge portion of each of the third plurality of structures aligns with an edge portion of at least one of the second plurality of structures, wherein:
   the first collection comprises a first structure of the first plurality of structures defining a first plurality of quadrants, one of the second plurality of structures being located within each of the first plurality of quadrants, each of the one of the second plurality of structures defining a second plurality of quadrants, one of the third plurality of structures being located within each of the second plurality of quadrants, the first collection comprising a recursive pattern; and
   the second collection comprises at least some others of the second plurality of structures and at least some others of the third plurality of structures.

2. The apparatus of claim 1, wherein the non-uniform introduced pattern comprises a fractal pattern.

3. The apparatus of claim 1, wherein one or more of the plurality of structures are truncated.

4. An apparatus comprising:
an inductor formed on a semiconductor die, the inductor comprising at least one loop formed on a metal layer; and
a non-uniform introduced fractal pattern formed on the metal layer and circumscribed by the at least one loop, wherein the non-uniform introduced fractal pattern comprises:
a first plurality of structures each having a horizontal portion and a vertical portion that crosses the horizontal portion, the horizontal portion and the vertical portion having a minimum width according to design rule checking (DRC) requirements; and
a second plurality of structures each adapted at a minimum distance according to the DRC requirements from at least one of the first plurality of structures, each of the second plurality of structures smaller than the first plurality of structures and having a horizontal portion and a vertical portion that crosses the horizontal portion, the horizontal portion and the vertical portion having the minimum width, wherein each of at least some of the first plurality of structures defines a plurality of quadrants and at least one of the second plurality of structures is located within each of the plurality of quadrants of each of the at least some of the first plurality of structures; and
a third plurality of structures each adapted at the minimum distance according to the DRC requirements from at least one of the first plurality of structures and at least one of the second plurality of structures, each of the third plurality of structures larger than the second plurality of structures and having a horizontal portion and a vertical portion, the horizontal portion and the vertical portion having the minimum width.

5. The apparatus of claim 4, wherein an edge portion of each of the second plurality of structures aligns with an edge portion of at least one of the first plurality of structures.

6. The apparatus of claim 4, wherein one or more of the first plurality of structures and/or one or more of the second plurality of structures have different shapes.

7. The apparatus of claim 4, wherein the non-uniform fractal pattern further comprises another structure at a peripheral portion thereof, the another structure having the minimum width and comprising a shape different than the first plurality of structures and the second plurality of structures.

8. The apparatus of claim 4, wherein the apparatus comprises an oscillator comprising:
a first plurality of transistors coupled between a first voltage node and an output node;
a second plurality of transistors coupled between a second voltage node and the output node; and
a load circuit coupled to the output node, the load circuit comprising the inductor and at least one capacitor, wherein the oscillator is to output an oscillation signal at the output node.

9. An apparatus comprising:
an inductor formed on a semiconductor die, the inductor comprising at least one loop formed on a metal layer; and
a non-uniform introduced fractal pattern formed on the metal layer and circumscribed by the at least one loop, wherein the non-uniform introduced fractal pattern comprises:
at least one first structure having a horizontal portion and a vertical portion that crosses the horizontal portion, the horizontal portion and the vertical portion having a minimum width according to design rule checking (DRC) requirements;
a second plurality of structures each adapted at a minimum distance according to the DRC requirements from the at least one first structure, each of the second plurality of structures smaller than the at least one first structure and having a horizontal portion and a vertical portion that crosses the horizontal portion, wherein the at least one first structure defines a first plurality of quadrants and at least one of the second plurality of structures is located within each of the first plurality of quadrants of the at least one first structure;
a third plurality of structures each adapted at the minimum distance according to the DRC requirements from the at least one first structure and at least one of the second plurality of structures, each of the third plurality of structures larger than the second plurality of structures and having a horizontal portion and a vertical portion, wherein each of the third plurality of structures defines a second plurality of quadrants and at least one of the second plurality of structures is located within each of the second plurality of quadrants;
a fourth plurality of structures each adapted at the minimum distance according to the DRC requirements from the at least one first structure and at least one of the third plurality of structures, each of the fourth plurality of structures comprising an 'H' pattern, the 'H' pattern having a vertical orientation; and
a fifth plurality of structures each adapted at the minimum distance according to the DRC requirements from the at least one first structure and at least one of the third plurality of structures, each of the fifth plurality of structures comprising a second 'H' pattern, the second 'H' pattern having a horizontal orientation,
wherein the non-uniform introduced fractal pattern is separated from the at least one loop by at least a multiple of a distance from the metal layer to a substrate of the semiconductor die.

10. The apparatus of claim 9, further comprising another plurality of structures each adapted at the minimum distance according to the DRC requirements from the at least one first structure and at least one of the second plurality of structures, each of the another plurality of structures comprising a truncated pattern.

11. The apparatus of claim 9, further comprising a sixth plurality of structures each adapted at a minimum distance according to the DRC requirements from at least one of the fifth plurality of structures, each of the sixth plurality of structures smaller than the at least one first structure and having a horizontal portion and a vertical portion that crosses the horizontal portion.

* * * * *